(12) United States Patent
Tan

(10) Patent No.: US 11,898,927 B2
(45) Date of Patent: Feb. 13, 2024

(54) REAL-EQUIVALENT-TIME OSCILLOSCOPE WITH TIME DOMAIN REFLECTOMETER

(71) Applicant: Tektronix, Inc., Beaverton, OR (US)

(72) Inventor: Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 17/735,025

(22) Filed: May 2, 2022

(65) Prior Publication Data

US 2022/0357237 A1 Nov. 10, 2022

Related U.S. Application Data

(60) Provisional application No. 63/184,723, filed on May 5, 2021.

(51) Int. Cl.
*G01R 31/11* (2006.01)
*G01M 11/00* (2006.01)
*G01R 27/06* (2006.01)

(52) U.S. Cl.
CPC .... *G01M 11/3118* (2013.01); *G01M 11/3145* (2013.01); *G01R 27/06* (2013.01)

(58) Field of Classification Search
CPC .......... G01M 11/3145; G01M 11/3118; G01R 27/32; G01R 27/06; G01R 13/0218; G01R 31/31709; H04B 3/46
See application file for complete search history.

(56) References Cited

U.S. PATENT DOCUMENTS 6,242,899 B1 * 6/2001 Miller ................ G01R 13/345
324/76.24
2011/0187381 A1 * 8/2011 Ems ...................... G01R 31/11
324/533

(Continued)

*Primary Examiner* — Thang X Le
(74) *Attorney, Agent, or Firm* — Miller Nash LLP; Andrew J. Harrington

(57) ABSTRACT

A test and measurement device includes one or more ports configured to connect to a device under test (DUT), a time domain reflectometry (TDR) source configured receive a source control signal and to produce an incident signal to be applied to the DUT, one or more analog-to-digital converters (ADC) configured to receive a sample clock and sample the incident signal from the TDR source and a time domain reflection (TDR) signal or a time domain transmission (TDT) signal from the DUT to produce an incident waveform and a TDR/TDT waveform, one or more processors configured to execute code to cause the one or more processors to: control a clock synthesizer to produce the sample clock and the source control signal, and use a period of the TDR source, a period of the sample clock, and the number of samples to determine time locations for samples in the incident waveform and the TDR/TDT waveform, and a display configured to display the incident waveform and the TDR/TDT waveform. A method of sampling a waveform using a real-equivalent-time oscilloscope having a time domain reflectometry source, comprising: controlling a clock synthesizer to produce a sample clock and a source control signal; using a time domain reflectometry (TDR) source to receive the source control signal and to produce an incident signal to be applied to a device under test (DUT); receiving the sample clock at one or more analog-to-digital converters (ADC) and sampling the incident signal from the TDR source and a TDR/TDT signal from the DUT to produce an incident waveform and a TDR/TDT waveform; determining time locations for samples in the incident waveform and the TDR/TDT waveform, using a period of (Continued)

the TDR source, a period of the sample clock, and a number of samples; and displaying the incident waveform and the TDR/TDT waveform.

20 Claims, 9 Drawing Sheets

(56) References Cited

U.S. PATENT DOCUMENTS

2016/0337512 A1* 11/2016 Kalavai .................... H04B 3/48
2019/0229981 A1*  7/2019 Chappell ................ G01R 31/08

* cited by examiner

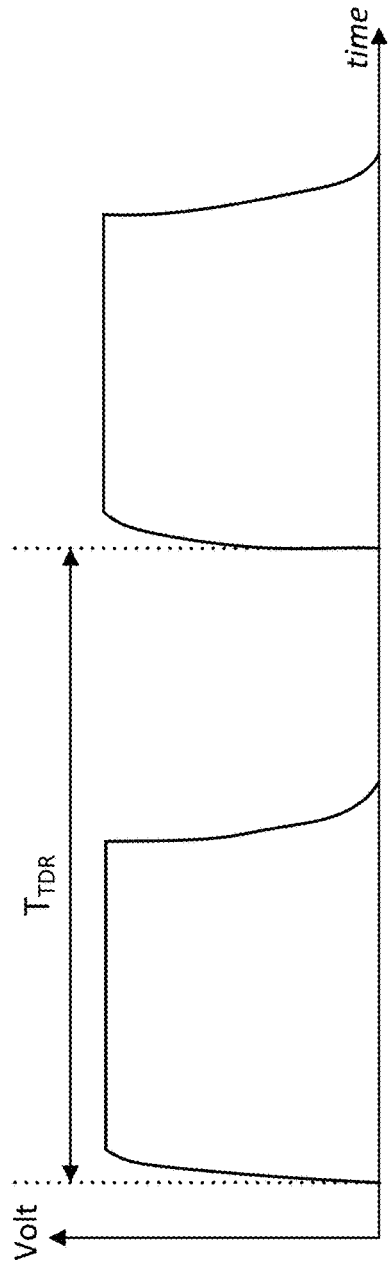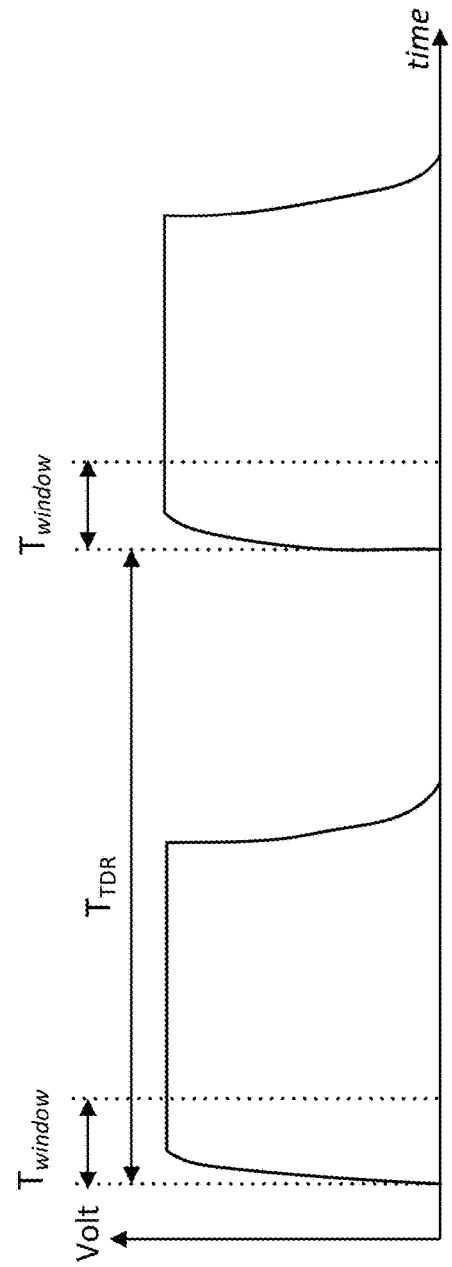

REAL-EQUIVALENT-TIME OSCILLOSCOPE WITH TIME DOMAIN REFLECTOMETER

CROSS-REFERENCE TO RELATED APPLICATIONS

This disclosure claims benefit of U.S. Provisional Application No. 63/184,723, titled "REAL EQUIVALENT TIME OSCILLOSCOPE WITH TIME DOMAIN REFLECTOMETER," filed on May 5, 2021, the disclosure of which is incorporated herein by reference in its entirety.

TECHNICAL FIELD

This disclosure relates to test and measurement instruments, and more particularly to a real-equivalent-time (RET) oscilloscope.

BACKGROUND

High-speed system testing/debugging involves signal integrity analysis on the waveforms acquired by an oscilloscope ("scope"), including real-time (RT) oscilloscopes, equivalent-time (ET), or sampling, oscilloscopes, and real-equivalent-time (RET) oscilloscopes. RT scopes generally capture an entire waveform representing a signal generated by a device under test (DUT) in one trigger event, capturing a large number of data points in one continuous record. ET scopes typically measure one input sample per trigger event, and repeat that process, adding small delay each time, until enough samples are collected to reconstruct the entire waveform. An RET oscilloscope samples at a rate lower than a RT scope and higher than an ET scope, and uses a software clock recovery to reconstruct the waveform without using a hardware trigger.

High-speed system testing/debugging also involves network analysis. Network analysis may be performed by using time domain reflectometry (TDR) and/or time domain transmissometry (TDT), and/or a vector network analyzer (VNA). More information about network analysis can be found in Tektronix, Inc., "IConnect SW for DSA8300 Sampling Oscilloscope," available at https://www.tek.com/datasheet/product-software/iconnect-dsa8300 (hereinafter "IConnect"). Another resource can be found at Keysight Technologies, Inc., "S-Parameter Design," available at https://www.keysight.com/us/en/assets/7018-06743/application-notes/5952-1087.pdf (hereinafter "S-Parameter Design").

Typically, ET scopes having a TDR source can measure TDR and/or TDT in the time domain. The time domain TDR/TDT results are then converted to the frequency domain S-parameters. TDR/TDT and S-parameters allow one to check the impedance of the data link, the reflection and the insertion loss of the channel, and the crosstalk impact on the victim channel. High-speed serial data testing may use S-parameters to perform embed/de-embed processes.

BRIEF DESCRIPTION OF THE DRAWINGS

FIG. 4 shows a diagram of an embodiment of a TDR step signal.

FIG. 5 shows a diagram of a portion of a whole TDR period used for time domain measurements.

DESCRIPTION

Embodiments here incorporate TDR functionality to an RET oscilloscope to perform TDR and TDT measurements. Two other types of signals are also considered to measure TDR/TDT on the RET oscilloscopes. In the embodiments, the TDR source and the sampling circuitry in the scope share the system clock. The device maps the acquired samples directly to the pattern waveforms without requiring the standard RET software clock recovery that is typically used to recover clock for high-speed digital signals. However, as discussed in more detail further, the embodiments comprise more than just combining a TDR source into an RET scope.

Figure 1:
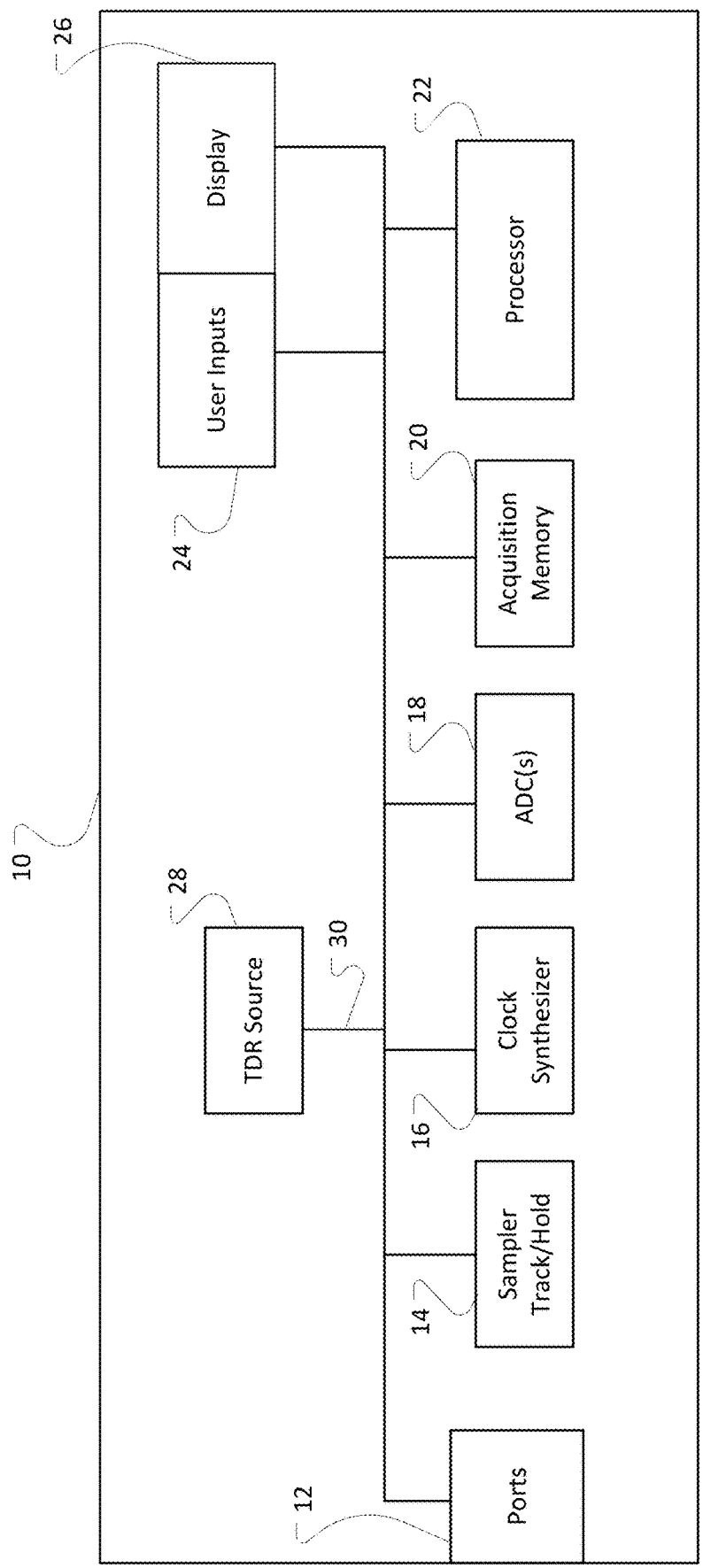
FIG. 1 shows an embodiment of a test and measurement device.

FIG. 1 shows an embodiment of a test and measurement device 10 having TDR functionality. The below discussion will refer to this device as an RET oscilloscope ("RET scope"), but no limitation to an oscilloscope is intended. FIG. 1 illustrates an example block diagram of a real-equivalent-time test and measurement instrument 10 according to some configurations of the disclosure. The test and measurement instrument 10 includes one or more ports 12, which may be any electrical signaling medium. Ports 12 may include receivers, transmitters, and/or transceivers. Each port 12 may comprise a channel of the test and measurement instrument 10. An example of an RET oscilloscope is discussed in U.S. patent application Ser. No. 17/182,056 (the '056 application), filed Feb. 22, 2021, and published as US Pat. App. Pub. No. 2021/0263085, incorporated by reference in its entirety here.

A port 12 receives a signal from a DUT and sends it to a sampler track and hold circuit 14. The track and hold circuit 14 holds each signal steady for a period of time sufficient to enable acquisition by one or more high-resolution analog-to-digital converter(s) (ADC) 18. The ADC may receive a sample clock from the clock synthesizer 16 under control of one or more processors 22.

The ADC 18 converts the analog signal from the track and hold circuit 14 to a digital signal. The ADC 18 may have a sampling rate greater than equivalent-time test and measurement instruments, but less than real-time test and measurement instruments. For example, the ADC 18 can sample the signals from a few GS/s to tens of GS/s. In some configurations, the ADC 18 can sample the analog signal between 1 GS/s to 100 GS/s. In other configurations, the ADC 18 can sample the analog signal between 2 GS/s and 25 GS/s. The digitized signal from the ADC 18 can then be stored in an acquisition memory 20. That is, the sampling rate is set such that the Nyquist frequency, which is half the sampling rate, is lower than the analog bandwidth of the ADC 18. The ADC 18 could be a single high-resolution ADC, such as a 12-bit ADC.

The one or more processors 22 may be configured to execute instructions from memory and may perform any methods and/or associated steps indicated by such instructions. These may include receiving the acquired signals from the acquisition memory 20 and reconstructing the signal under test without the use of a hardware trigger or acquiring the sample in the high acquisition rate.

Memory 20 or any other memory on the test and measurement instrument 10 may be implemented as processor cache, random access memory (RAM), read only memory (ROM), solid state memory, hard disk drive(s), or any other memory type. Memory acts as a medium for storing data, computer program products, and other instructions.

User interface 24 is coupled to the one or more processors 22. User interface 24 may include a keyboard, mouse, trackball, touchscreen, and/or any other controls employable by a user to interact with a GUI on the display 26. The display 26 may be a digital screen, a cathode ray tube based display, or any other monitor to display waveforms, measurements, and other data to a user.

The test and measurement device of the embodiments includes a time domain reflectometry (TDR) source 28 that receives a control signal 30 from the clock synthesizer 16, which the processor(s) 22 typically controls.

While the components of the test and measurement instrument 10 are depicted as being integrated within test and measurement instrument 10, it will be appreciated by a person of ordinary skill in the art that any of these components can be external to the test and measurement instrument 10. They may couple to the test and measurement instrument 10 in any conventional manner, such as wired and/or wireless communication media and/or mechanisms. For example, in some examples, the display 26 may be remote from the test and measurement instrument 10.

Figure 2:
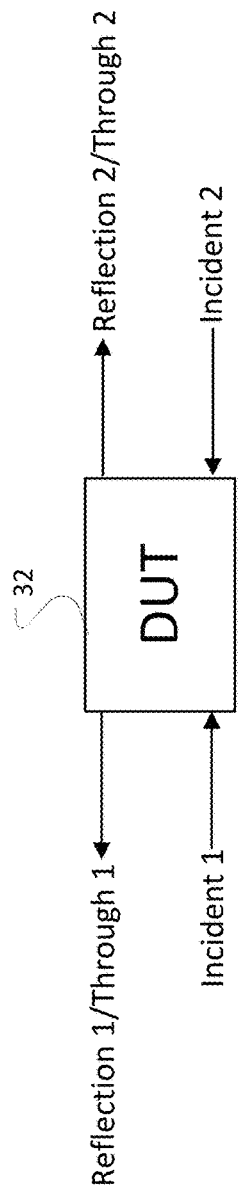
FIG. 2 shows a graphical representation of an S-parameter measurement or a TDR/TDT measurement.

FIG. 2 shows a diagram of the fundamental measurement of TDR/TDT and S-parameter. The Incident 1 signal is the incident waveform sent to the device under test (DUT) 32, the Reflection 1 signal comprises the TDR waveform with Incident 2 terminated. The Through 2 signal is the TDT waveform. The waveforms are acquired by an oscilloscope or other data acquisition device such as a digitizer. The ratio of the Reflection signal over the Incident signal in the frequency domain is defined as the reflection ratio. The ratio of the Through signal over the Incident signal in the frequency domain is defined as the insertion loss. See, for example, S-Parameter Design.

In the below discussion, the terms "incident signal" or "incident" means the signal or waveform generated by the TDR source. The terms "time domain signal," "time domain waveform," or "TD waveform" means the time domain reflection (TDR), time domain transmission (TDT), or other signal the DUT generates in response to the incident signal.

Figure 3:
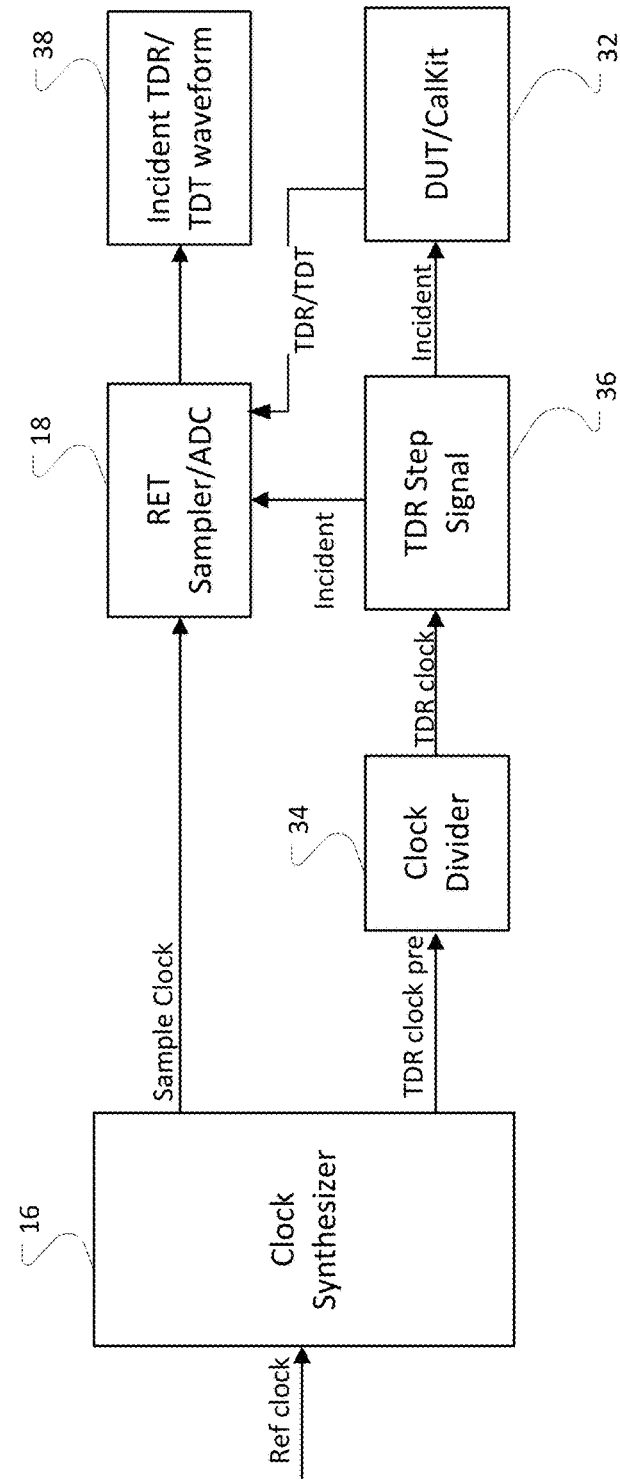
FIG. 3 shows a block diagram of a portion of an embodiment of a test and measurement device having a TDR source comprising a step signal

FIG. 3 shows a portion of an embodiment of a test and measurement device, such as the test and measurement device 10 of FIG. 1, in which the TDR source, such as the TDR Source 28 of FIG. 1, comprises a TDR Step Signal 36, typically a voltage or current source, and a clock divider 34. The TDR clock produced by the clock divider 34 drives the TDR Step Signal, which comprises the Incident signal shown in FIG. 2. In this embodiment, the TDR control signal 30 from FIG. 1 comprises a TDR clock preliminary signal from the clock synthesizer 16 to the clock divider 34.

The time domain (TD) signal of FIG. 3 comprises the Reflection/Through signal shown in FIG. 2. The RET oscilloscope channels acquire both the Incident signal and the Reflection/Through signal as the Incident waveform and the TD waveform (collectively also called "time domain (TD) waveform") as shown at a block 38. The network analysis on the RET oscilloscope such as S-parameter analysis, Z-line analysis can be performed as in the ET oscilloscope once it acquires the pattern waveforms. This embodiment may use only one of the one or more ADC 18.

The RET oscilloscope ADC 18 samples at a fixed sample rate asynchronous to the repetitive rate of the TDR Step Signal. In FIG. 4, the TDR Step Signal has a period of $T_{TDR}$. The RET oscilloscope samples at the sample period of $T_{sample}$. In the RET oscilloscope, the sample rate is not sufficient for preventing aliasing. Equation (1) is used to put the samples to the corresponding location in the signal pattern waveform:

$$t_{RET}(i) = \mathrm{mod}(i*T_{sample}, T_{TDR}) \quad (1)$$

where the mod function yields the remainder of $i*T_{sample}$ divided by $T_{TDR}$.

The RET sample rate is not high enough to prevent aliasing. For example, the sample period could be $T_{sample}=500$ ps for 2 GS/s sample rate while the analog bandwidth could be 70 GHz, as discussed in the '056 application. The "Clock Synthesizer" and the "Clock Divider" can be configured in the way that the $t_{RET}$ in the Equation (1) covers the waveform span with sufficient density. For example:

Ref clock=10 MHz. This is typical for test instruments.

Clock Synthesizer creates "Sample clock"=2 GHz by 200*RefClock=200*10 MHz=2 GHz.

Clock Synthesizer creates "TDR clock pre"=2.01 GHz by 201*RefClock=201*10 MHz=2.01 GHz.

The TDR clock is chosen to cover the settling time of the TDR/TDT waveforms. For a target TDR clock period above 10 µs, the following Equation (2) and (3) may be used to choose clock divider value for the equivalent sample period for the RET oscilloscope:

$$T_{sample\_RET} = \mathrm{mod}(T_{TDR}, T_{sample}) \quad (2)$$

where mod is the mod operation which yields the remainder of division. And $$T_{TDR} = \text{TDR clock pre} * \text{Clock Divider} \quad (3)$$

The value of Clock Divider can be chosen from the (2) and (3) to make both the value of $T_{sample\_RET}$ and the value of $T_{TDR}$ being close to the desired values. For example, the following value of the Clock Divider can be chosen to get about 2.5 ps as the reminder in Equation (2), which is the $T_{sample\_RET}$:

Clock Divider=20099

With this configuration, the TDR period $T_{TDR}$ is nearly 10 µs:

$$T_{TDR} = TDR \text{ clock pre} * \text{Clock Divider} = \frac{1}{2.01 \text{ GHz}} * 20099 = 9.9995 \text{ us}$$

FIG. 5 shows that the oscilloscope usually takes the TD waveform measurement in a window portion of the $T_{TDR}$, denoting the window duration as $T_{window}$. The RET oscilloscope acquires samples over the full duration of $T_{TDR}$, meaning only a portion of the raw acquired samples are useful for the TD waveform measurement.

For a typical S-parameter measurement, the frequency resolution is about 10 MHz. It requires time window of 100 ns. A typical TDR signal with repeat rate of 100 kHz has the period of 10 µs. In this case the $T_{window}$ is 1% of $T_{TDR}$, for the RET oscilloscope sampling at 2 GS/s, as discussed in the '056 application, the effective sample rate for TDR/TDT is 1% of the RET sampling rate, yielding an effective sample rate of 20 MS/s. The effective sample rate of 20 MS/s is 100 times higher than the typical ET sampling oscilloscope's sample rate of 200 kS/s. The speed advantage of the RET oscilloscope over the ET oscilloscope can achieve faster measurement, and it can achieve higher accuracy since more data is taken for the same acquisition time. With 100 times more data on average, the random noise in the measurement system can be reduced by 20 dB since:

$$20*\log_{10}\sqrt{100}=20 \text{ dB}.$$

With 10 times more data on average, the noise reduction would be 10 dB.

Bypassing a gain stage in the RET oscilloscope can improve the vertical noise for the TDR/TDT measurement because it avoids the vertical noise caused by the pre-amp. An ADC with higher resolution also helps in reducing noise.

The RET oscilloscope with the TDR source and TD measurement may include a procedure to apply a calibration kit (Calkit) to conduct short-open-load-through (SOLT) or similar calibration. The calibration can establish the reference planes accurately. The calibration kit may be placed in place of the DUT 32 to provide known signals to the ADC 18 for calibration as shown in FIG. 3.

Figure 6:
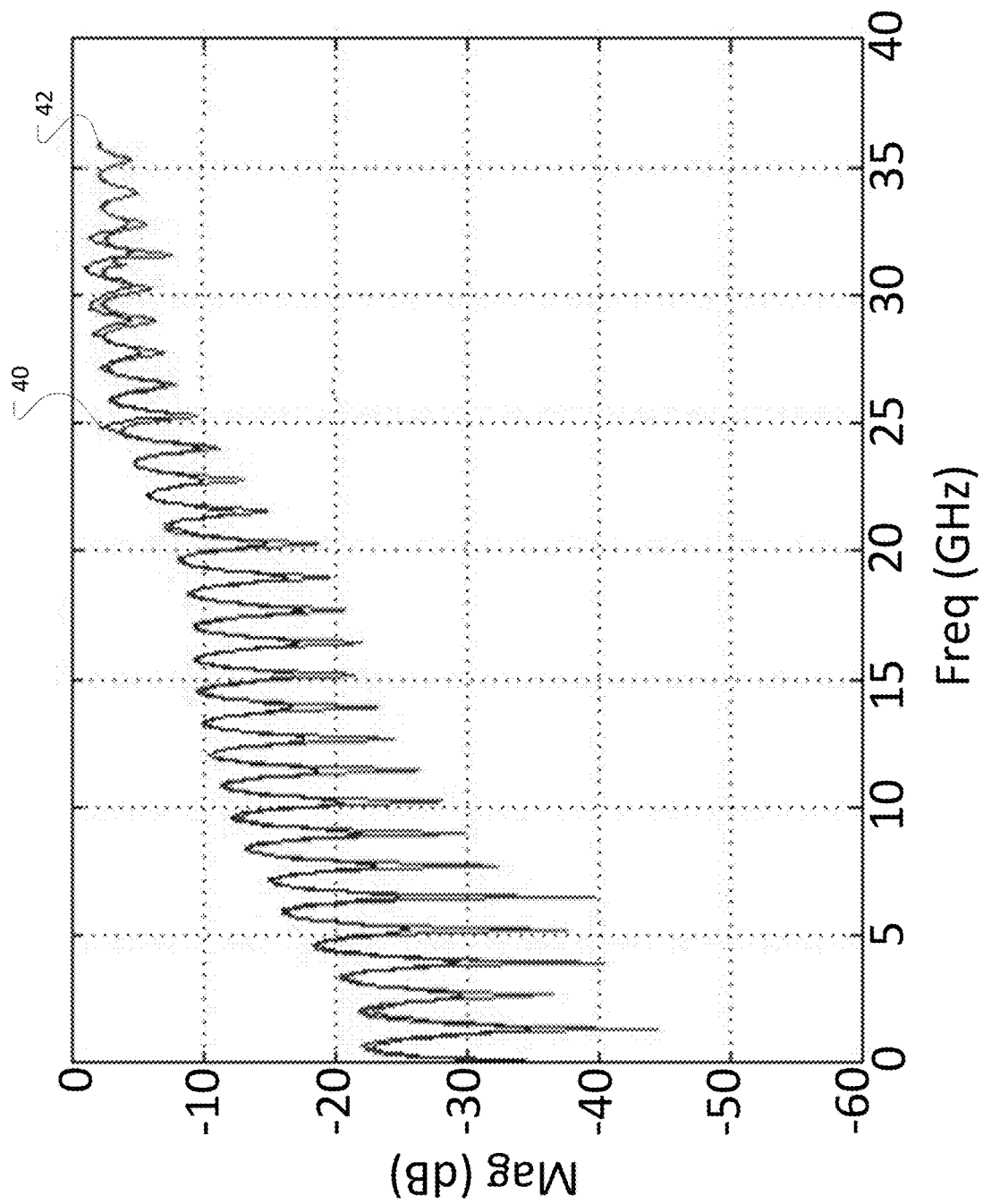
FIG. 6 shows a graph of return loss of a printed circuit board trace.
Figure 7:
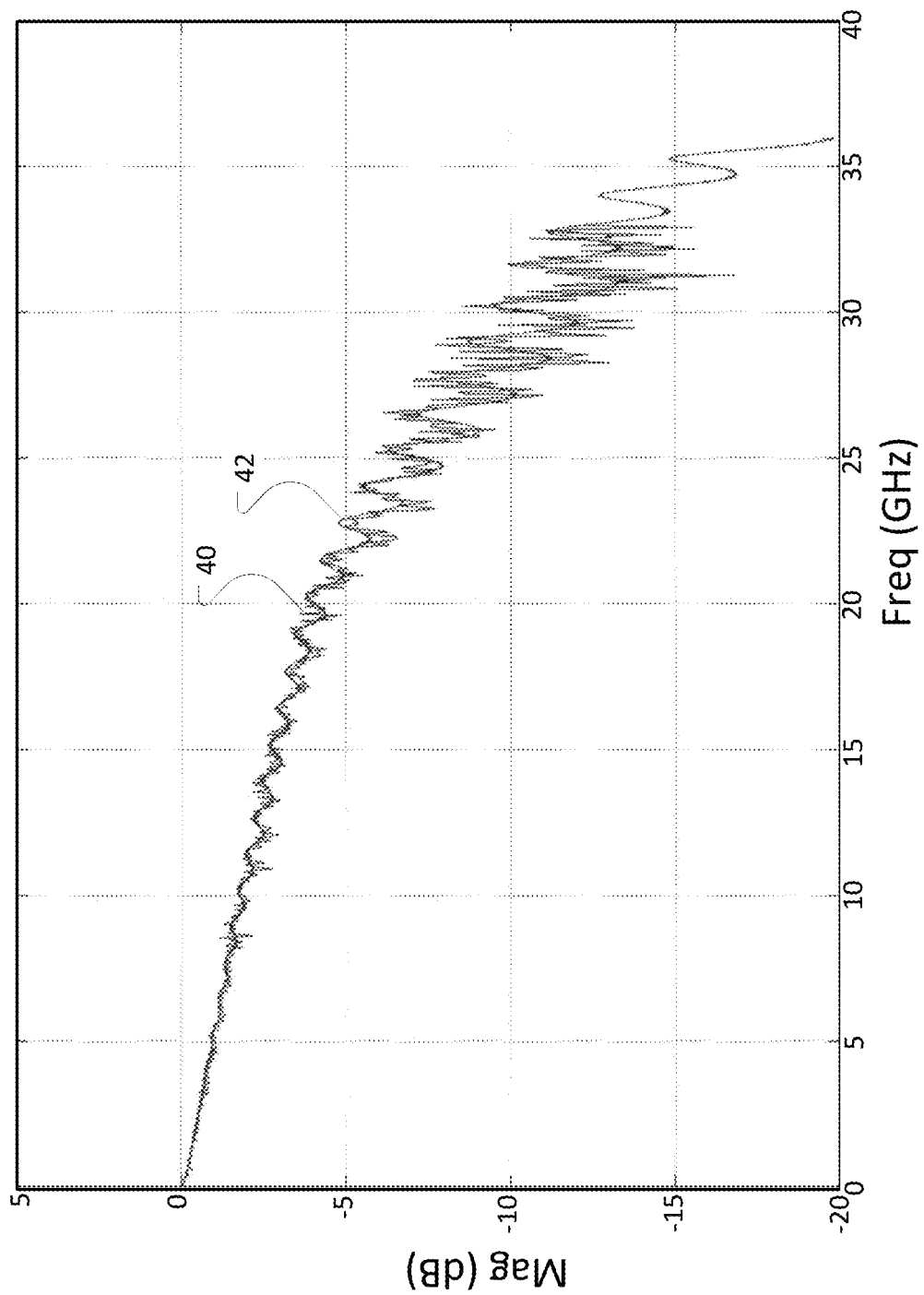
FIG. 7 shows a graph of insertion loss of a printed circuit board trace.

The inventors demonstrated an RET scope with TDR/TDT functionality using a real-time oscilloscope with an external fast step signal source. FIG. 6 shows the comparison of the return loss term, referred to as S11, of a 2.4 inch printed circuit board trace measured by the RET oscilloscope having TDR as the curve 40, and by the VNA as the curve 42. FIG. 7 shows a similar comparison for the insertion loss, referred to as S21, with the same two sources of curves 40 and 42.

Figure 8:
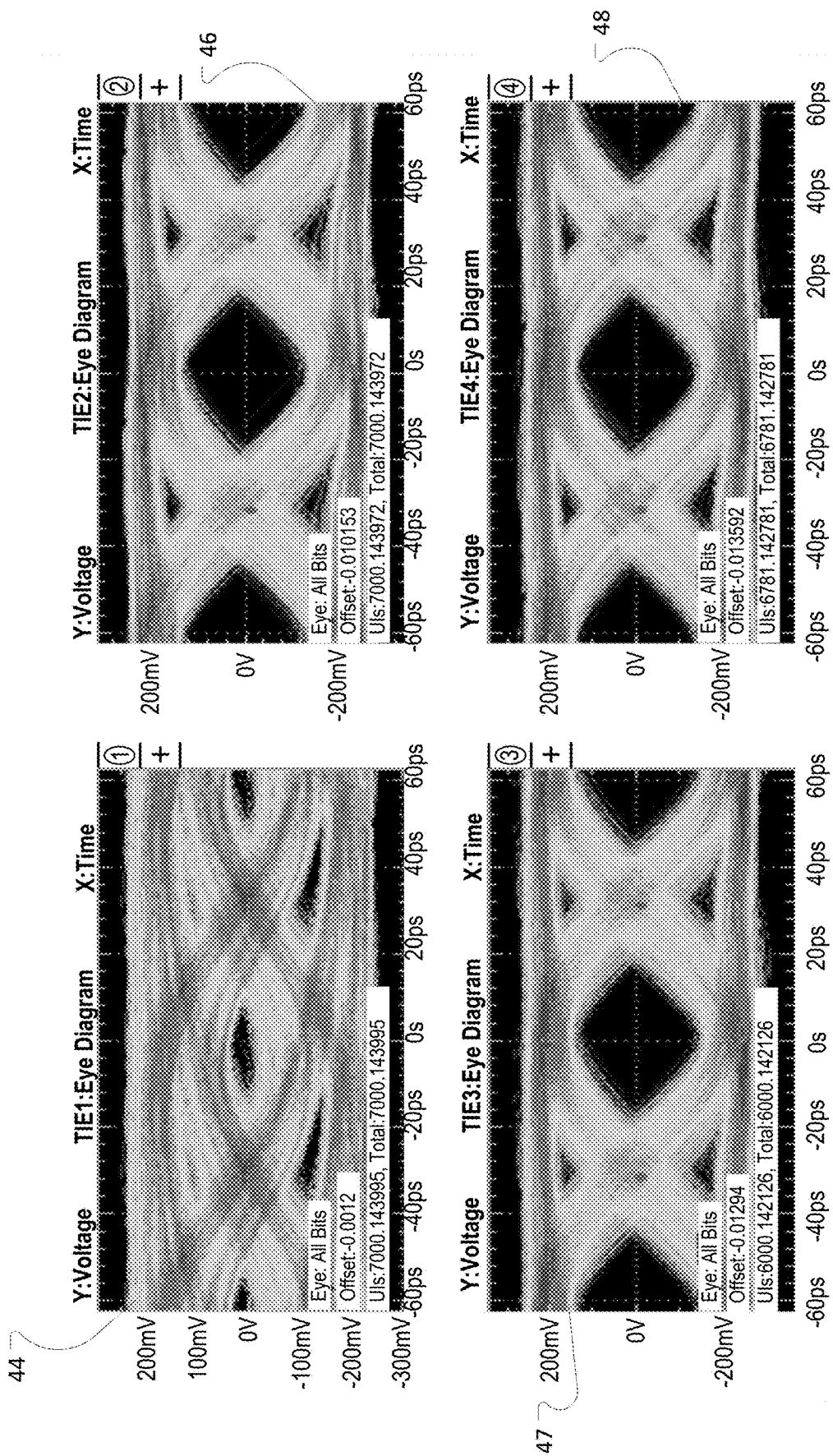
FIG. 8 shows eye diagrams of measured signals and de-embed signals using the S-parameter measured by VNA and measured by TDR/TDT.

FIG. 8 shows the eye diagrams for a 16 Gb/s NRZ (non-return-to-zero) signal. These resulted from using a longer PCB trace to better demonstrate deemed effects as the longer PCB trace creates greater ISI (inter-symbol-interference). Eye diagram 44 at the top left represents a waveform acquired at the end of a 12-inch PCB trace. The eye diagram shows large ISI caused mainly by the channel insertion loss. Eye diagram 46 represents the waveform acquired before the 12 inch PCB trace. The eye diagram 46 has a wide open eye. This eye diagram serves as the golden reference for a deembeded waveform acquired at the end of the channel. The bottom left 47 shows the eye diagram representing the deembeded waveform using the S-parameter measured using VNA, and the bottom right 48 shows the eye diagram representing the deembeded waveform using the S-parameter measured using the oscilloscope with TDR/TDT.

The numerical example shows that the S-parameters measured by VNA and the S-parameters measured by TDR are closely matched at lower frequencies, the difference increases at higher frequencies. The deembed results are comparable between using VNA measured S-parameter and using the oscilloscope measured S-parameter, and the deembed eye diagrams match the golden reference eye diagram.

Figure 11:
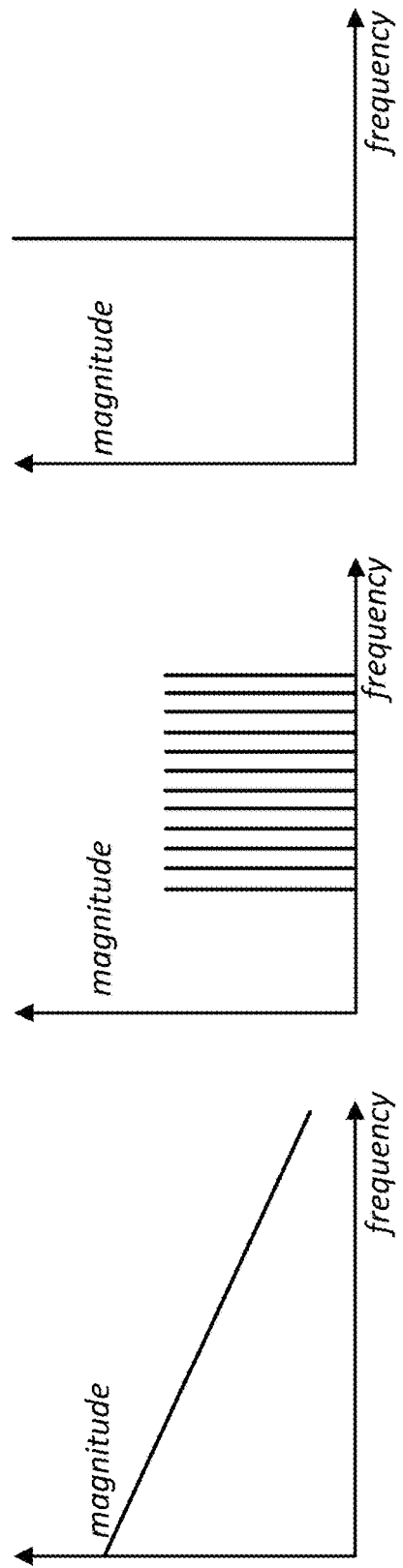
FIG. 11 shows a diagram of spectrums of different TDR sources.

The spectrum of a step signal has magnitude following 1/f profile as shown in FIG. 11. The energy decreases at higher frequencies. With constant noise level, the signal-noise-ratio (SNR) decreases at higher frequency. This is a limitation on the step based TDR/TDT solution. The numerical examples shown in FIG. 6 and FIG. 7 show increased inaccuracy at higher frequencies. Increasing the number of averages can mitigate the SNR. However, increasing the number of averages increases the time it takes to perform the TDR/TDT measurements.

Figure 9:
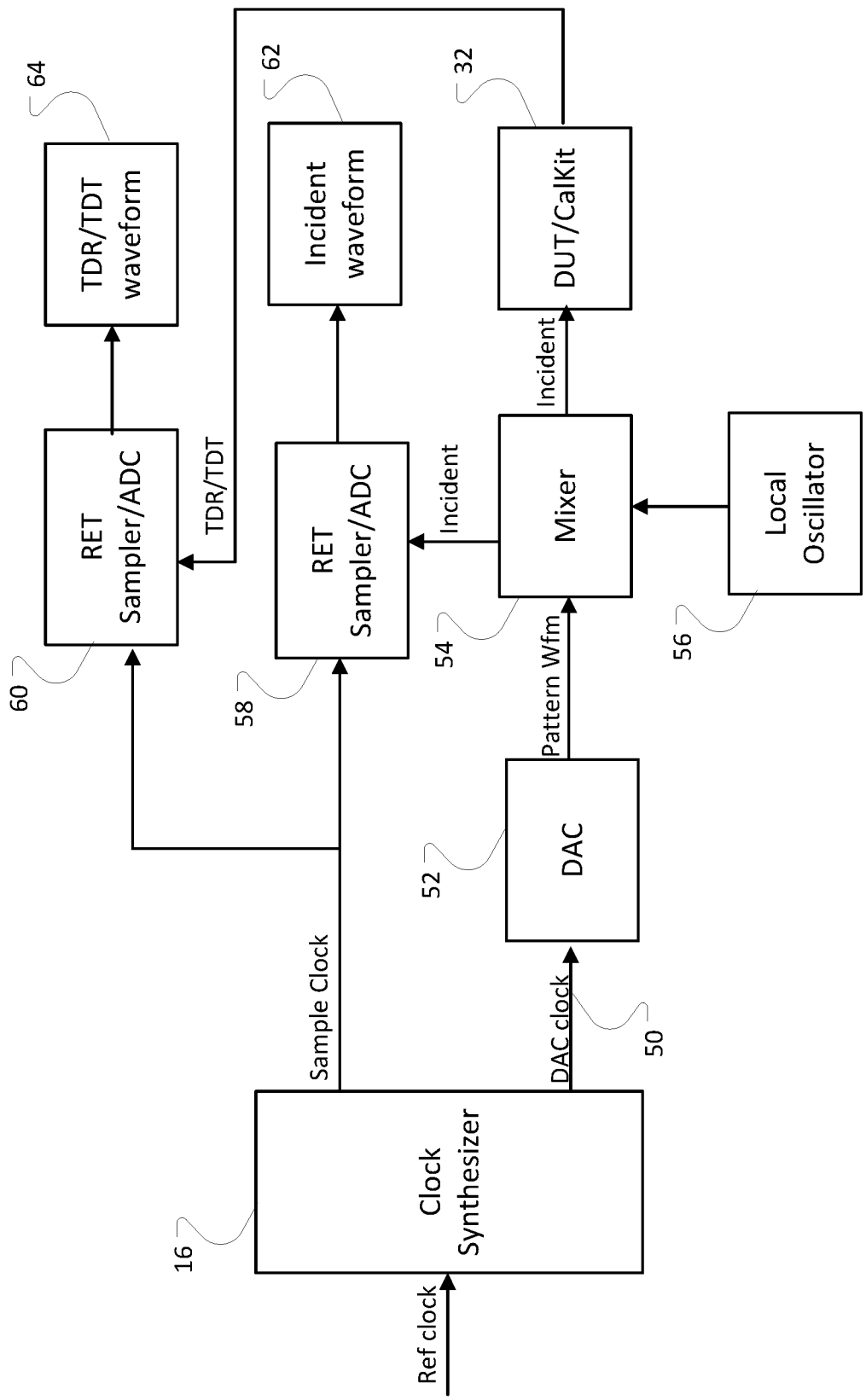
FIG. 9 shows a block diagram of a portion of an embodiment of a test and measurement device having a TDR source comprising a DAC and mixer source.

FIG. 9 shows another embodiment of a TDR source 28 in an RET oscilloscope 10. In this embodiment, the TDR source comprises a digital-to-analog converter (DAC) 52 to create a bandwidth-limit pattern waveform, and a local oscillator (LO) 56 and mixer 54 to cover different frequency bands. In this embodiment, the source control signal 30 is a DAC clock 50 sent from the clock synthesizer 16 to the DAC 52.

The DAC 16 can create a pattern waveform signal that contains multiple harmonics with constant energy over a limited bandwidth and provide that pattern waveform signal to the mixer 54. The arbitrary waveform generator (AWG) is a commercially available DAC-based signal generator. For TDR/TDT measurement, the pattern waveform signal contains multiple harmonics and is typically implemented with programed phases for each harmonic. This better utilizes the DAC vertical range. For example, to generate 100 harmonics, aligning the phases of all the harmonics results in the time domain signal looking like a narrow pulse. With limited DAC vertical range, the signal coming out of DAC will have limited energy. Randomized phases of the harmonics results in a pattern waveform signal that would look like a random noise and reduces the peak of the time domain signal. With the same DAC vertical range, the signal comes out of DAC will have higher energy. It will help with SNR, resulting in more accurate TDR/TDT measurements at higher frequencies.

The pattern waveform signal received at the mixer 54 is mixed with the LO signal from the local oscillator 56 to produce the incident signal. In this embodiment, the ADC 18 comprises two ADCs. One ADC 58 receives the incident signal to produce the incident waveform as shown at block 62. The DUT 32 also receives the incident waveform signal and generates the TDR/TDT signal for the ADC 60 to produce the TDR/TDT waveform as shown at block 64. The waveform may be used for display, analysis, etc.

Figure 10:
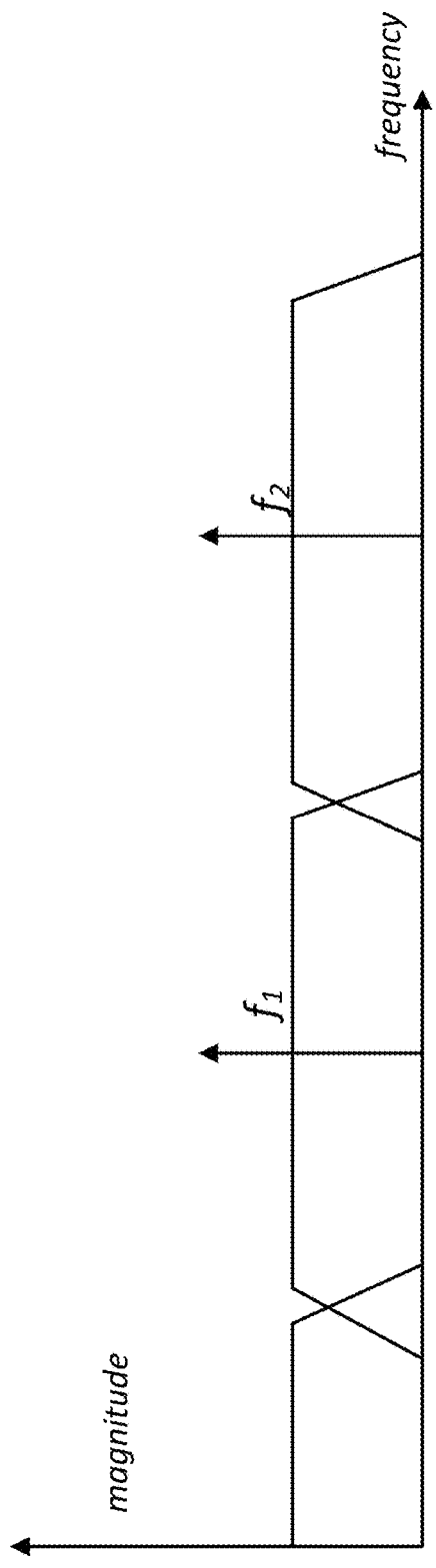
FIG. 10 shows a diagram of a spectrum of a DAC and mixer TDR source.

The mixer can be used to shift the spectrum of the signal generated from DAC to higher frequency bands and allows covering a wider spectrum. As shown in FIG. 10, mixing signals at frequency f1, f2, . . . creates the higher band signals for the TDR/TDT measurement. Note that the energy of the harmonics, when mixed to higher frequency, stays at constant energy level when the mixer has sufficient bandwidth. This property gives the DAC-and-mixer-based TDR source the advantage of better SNR over the step-based TDR source at higher frequencies, as shown in FIG. 11, discussed in more detail later.

The test and measurement device e.g., RET oscilloscope of FIG. 9 acquires the samples and uses the same Equation (1) to create the pattern waveform. The SOLT calibration works in the same way as when the system uses the step based TDR source.

Figure 12:
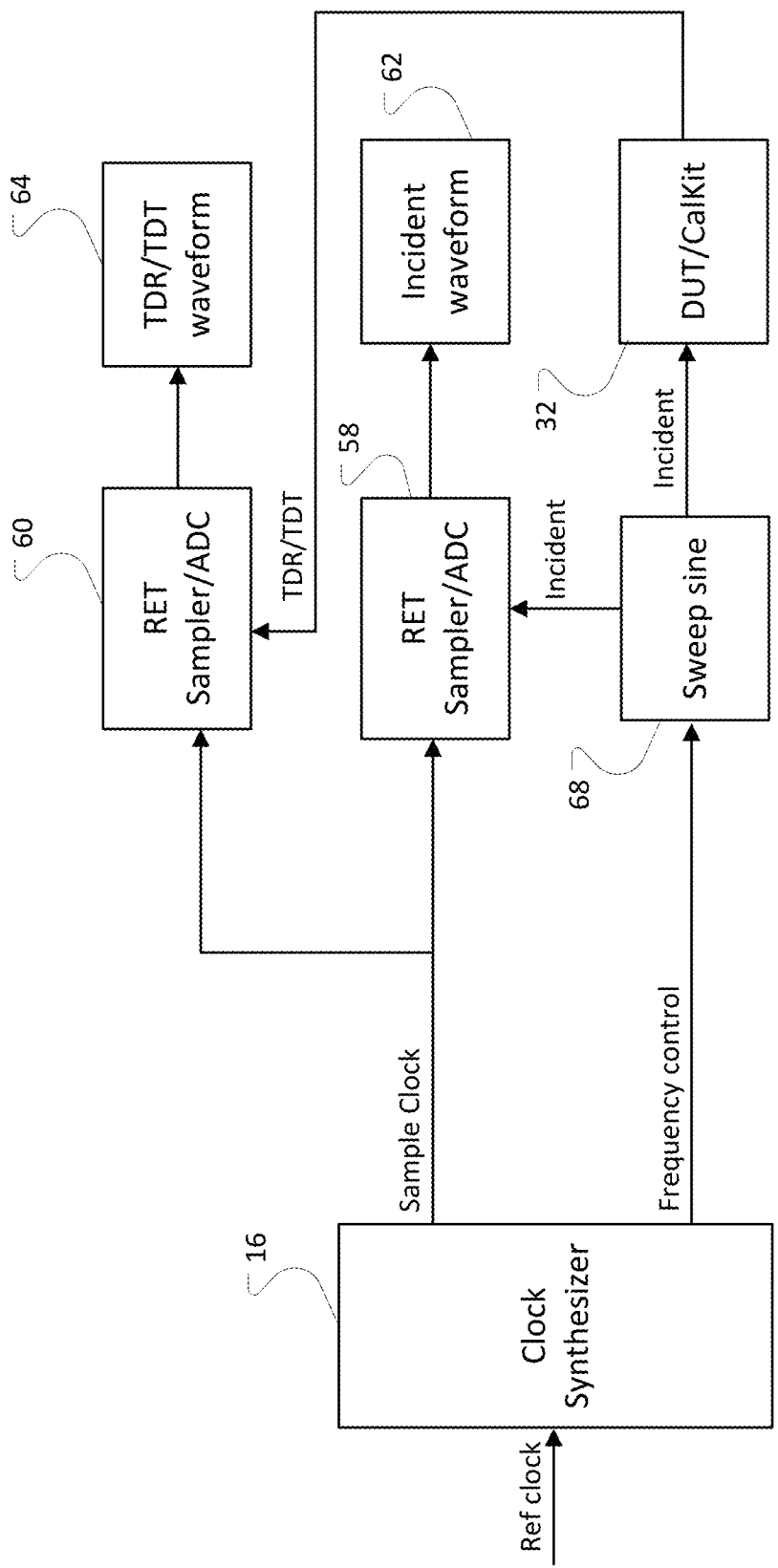
FIG. 12 shows a block diagram of a portion of an embodiment of a test and measurement device having a sweep sine signal source.

In another embodiment, shown in FIG. 12, the TDR source 28 in the RET scope 10 comprises a sinusoidal signal generator. The oscilloscope measures one frequency at a time in this embodiment. The source control signal 30 comprises the frequency control signal sent from the clock synthesizer 16 to the sine sweep source 68. It takes longer time to make the TDR/TDT measurement over frequencies than using the step-based TDR source, or using the DAC-and-mixer-based TDR source. This approach has the best SNR at each frequency because all the signal energy focuses on one harmonic, like a VNA that measures S-parameters at one frequency a time.

The test and measurement device e.g., RET oscilloscope of FIG. 12 acquires the samples, and then creates the sinusoidal waveform using same Equation (1) as the period of the sinusoidal signal is known. The SOLT calibration works in the same way as when the step based TDR source is used. The sine sweep generator 68 sends the incident signal to the incident ADC 58 to produce incident waveform as shown at block 62, and to the DUT 32. The DUT 32 then generates a TDR/TDT signal for the ADC 60 to produce TDR/TDT waveform as shown at block 64. The waveform may be used for display, analysis, etc.

FIG. 11 shows a comparison of magnitude versus frequency for the three different embodiments discussed here. FIG. 11 shows the step signal spectrum on the left, the DAC mixer spectrum in the middle, and the sine wave on the right.

This disclosure describes various embodiments of RET oscilloscopes with TDR. Being able to measure S-parameters up to higher frequencies and to capture and measure high-speed data waveforms, the RET oscilloscope becomes a versatile tool to perform both the network analysis and the waveform analysis required for the high-speed serial data test/measurement. The RET oscilloscope solution offers significant advantages over ET oscilloscope solutions. With the DAC based TDR source, the RET oscilloscope solution has the potential to provide accurate S-parameter at high frequencies.

Aspects of the disclosure may operate on a particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), Field Programmable Gate Array (FPGA), and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA, and the like. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description makes reference to particular features. It is to be understood that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

EXAMPLES

Illustrative examples of the disclosed technologies are provided below. An embodiment of the technologies may include one or more, and any combination of, the examples described below.

Example 1 is a test and measurement device, comprising: one or more ports configured to connect to a device under test (DUT); a time domain reflectometry (TDR) source configured receive a source control signal and to produce an incident signal to be applied to the DUT; one or more analog-to-digital converters (ADC) configured to receive a sample clock and sample the incident signal from the TDR source and a time domain reflection (TDR) signal or a time domain transmission (TDT) signal from the DUT to produce an incident waveform and a TDR/TDT waveform; one or more processors configured to execute code to cause the one or more processors to: control a clock synthesizer to produce the sample clock and the source control signal, and use a period of the TDR source, a period of the sample clock, and the number of samples to determine time locations for samples in the incident waveform and the TDR/TDT waveform; and a display configured to display the incident waveform and the TDR/TDT waveform.

Example 2 is the test and measurement device of Example 1, wherein the one or more processors are further configured to execute code to cause the one or more processors to determine time locations according to: $t_{RET}(i)$=mod $(i*T_{sample}, T_{TDR})$, wherein $T_{sample}$ is the period of the sample clock, and $T_{TDR}$ is the period of TDR clock signal and equals the initial TDR clock signal multiplied by a clock divider.

Example 3 is the test and measurement device of Example 2, wherein a sample period equals: $T_{sample\_RET}$=mod$(T_{TDR}, T_{sample})$.

Example 4 is the test and measurement device of any of Examples 1 through 3, wherein: the source control signal comprises a preliminary TDR clock signal; and the TDR source comprises a clock divider and a step signal generator, the clock divider configured to receive the source control signal to produce a TDR clock, the step signal generator to receive the TDR clock and produce the incident signal to be applied to the DUT.

Example 5 is the test and measurement device of any of Examples 1 through 4, wherein the one or more ADCs comprise one ADC configured to receive the incident signal from the TDR source and the TDR/TDT signal from the DUT.

Example 6 is the test and measurement device of any of Examples 1 through 5, wherein: the source control signal comprises a digital-to-analog converter (DAC) clock signal; and the TDR source comprises: a DAC configured to receive the DAC clock signal and produce a pattern waveform; a local oscillator to produce an oscillating signal; and a mixer configured to receive the pattern waveform from the DAC and the oscillating signal from the local oscillator and to produce the incident signal to be applied to the DUT.

Example 7 is the test and measurement device of Example 6, wherein the one or more ADCs comprises an incident ADC configured to receive the incident signal from the mixer, and a TDR/TDT ADC configured to to receive the TDR/TDT signal from the DUT.

Example 8 is the test and measurement device of Example 6, wherein the mixer and local oscillator are further configured to shift a spectrum of the pattern waveform to a higher frequency band.

Example 9 is the test and measurement device of any of Examples 1 through 8, wherein:
the source control signal comprises a frequency selection signal; and the TDR source comprises a signal generator configured to receive the frequency selection signal and generate a sine wave as the incident signal.

Example 10 is the test and measurement device of Example 9, wherein the one or more ADCs comprises an incident ADC configured to receive the incident signal from the signal generator and a TDR/TDT ADC configured to receive the TDR/TDT signal from the DUT.

Example 11 is a method of sampling a waveform using a real-equivalent-time oscilloscope having a time domain reflectometry source, comprising: controlling a clock synthesizer to produce a sample clock and a source control signal; using a time domain reflectometry (TDR) source to receive the source control signal and to produce an incident signal to be applied to a device under test (DUT); receiving the sample clock at one or more analog-to-digital converters (ADC) and sampling the incident signal from the TDR source and a TDR/TDT signal from the DUT to produce an incident waveform and a TDR/TDT waveform;
determining time locations for samples in the incident waveform and the TDR/TDT waveform, using a period of the TDR source, a period of the sample clock, and a number of samples; and a displaying the incident waveform and the TDR/TDT waveform.

Example 12 is the method of Example 11, wherein determining time locations for samples further comprises determining time locations of samples according to: $t_{RET}(i)$= mod$(i*T_{sample}, T_{TDR})$, wherein $T_{sample}$ is the period of the sample clock, and $T_{TDR}$ is the period of TDR clock signal and equals the initial TDR clock signal multiplied by a clock divider.

Example 13 is the method of Example 12, wherein a sample period equals: $T_{sample\_RET}$=mod$(T_{TDR}, T_{sample})$.

Example 14 is the method of any of Examples 11 through 14, wherein: the source control signal comprises a preliminary TDR clock signal; and wherein using the TDR source to receive the source control signal and to produce the incident signal to be applied to the DUT comprises: applying a clock divider to the preliminary TDR clock signal to produce a TDR clock; and using a step signal generator to receive the TDR clock and produce the incident signal to be applied to the DUT.

Example 15 is the method of Example 14, wherein sampling the incident signal at one or more ADCs comprises sampling the incident signal from the TDR source and the TDR/TDT signal from the DUT at one ADC.

Example 16 is the method of any of Examples 11 through 15, wherein: the source control signal comprises a digital-to-analog converter (DAC) clock signal; and wherein using the TDR source to receive the source control signal and to produce the incident signal to be applied to the DUT comprises: using a DAC to receive the DAC clock signal and to produce a pattern waveform; producing an oscillating signal; and mixing the pattern waveform from the DAC and the oscillating signal to produce the incident signal to be applied to the DUT.

Example 17 is the method of Example 16, wherein sampling the incident signal at one or more ADCs comprises sampling the incident signal from the TDR source at an incident ADC and the TDR/TDT signal from the DUT at a TDR/TDT ADC.

Example 18 is the method as claimed in claim 16, wherein mixing the pattern waveform and the oscillating signal comprises shifting a spectrum of the pattern waveform to a higher frequency band.

Example 19 is the method of any of Examples 11 through 16, wherein: the source control signal comprises a frequency selection signal; and wherein using the TDR source to receive the source control signal and to produce the incident signal to be applied to the DUT comprises: using a signal generator to receive the frequency selection signal and generate a sine wave as the incident signal to be applied to the DUT.

Example 20 is the method of any of Examples 16 to 19, wherein sampling the incident signal at one or more ADCs comprises sampling the incident signal from the TDR source at an incident ADC and the TDR/TDT signal from the DUT at a TDR/TDT ADC.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although specific aspects of the disclosure have been illustrated and described for purposes of illustration, it will be understood that various modifications may be made without departing from the spirit and scope of the disclosure. Accordingly, the disclosure should not be limited except as by the appended claims.

I claim:

1. A test and measurement device, comprising:
   one or more ports configured to connect to a device under test (DUT);
   a time domain reflectometry (TDR) source configured receive a source control signal and to produce an incident signal to be applied to the DUT;
   one or more analog-to-digital converters (ADC) configured to receive a sample clock and sample the incident signal from the TDR source and a time domain reflection (TDR) signal or a time domain transmission (TDT) signal from the DUT to produce an incident waveform and a TDR/TDT waveform;
   one or more processors configured to execute code to cause the one or more processors to:
      control a clock synthesizer to produce the sample clock and the source control signal, and
      use a period of the TDR source, a period of the sample clock, and the number of samples to determine time locations for samples in the incident waveform and the TDR/TDT waveform; and
   a display configured to display the incident waveform and the TDR/TDT waveform.

2. The test and measurement device as claimed in claim 1, wherein the one or more processors are further configured to execute code to cause the one or more processors to determine time locations according to:
   $t_{RET}(i) = \mod(i*T_{sample}, T_{TDR})$, wherein $T_{sample}$ is the period of the sample clock, and $T_{TDR}$ is the period of TDR clock signal and equals the initial TDR clock signal multiplied by a clock divider.

3. The test and measurement device as claimed in claim 2, wherein a sample period equals:

$$T_{sample\_RET} = \mod(T_{TDR}, T_{sample}).$$

4. The test and measurement device as claimed in claim 1, wherein:
   the source control signal comprises a preliminary TDR clock signal; and
   the TDR source comprises a clock divider and a step signal generator, the clock divider configured to receive the source control signal to produce a TDR clock, the step signal generator to receive the TDR clock and produce the incident signal to be applied to the DUT.

5. The test and measurement device as claimed in claim 4, wherein the one or more ADCs comprise one ADC configured to receive the incident signal from the TDR source and the TDR/TDT signal from the DUT.

6. The test and measurement device as claimed in claim 1, wherein:
   the source control signal comprises a digital-to-analog converter (DAC) clock signal; and
   the TDR source comprises:
      a DAC configured to receive the DAC clock signal and produce a pattern waveform;
      a local oscillator to produce an oscillating signal; and
      a mixer configured to receive the pattern waveform from the DAC and the oscillating signal from the local oscillator and to produce the incident signal to be applied to the DUT.

7. The test and measurement device as claimed in claim 6, wherein the one or more ADCs comprises an incident ADC configured to receive the incident signal from the mixer, and a TDR/TDT ADC configured to receive the TDR/TDT signal from the DUT.

8. The test and measurement device as claimed in claim 6, wherein the mixer and local oscillator are further configured to shift a spectrum of the pattern waveform to a higher frequency band.

9. The test and measurement device as claimed in claim 1, wherein:
   the source control signal comprises a frequency selection signal; and
   the TDR source comprises a signal generator configured to receive the frequency selection signal and generate a sine wave as the incident signal.

10. The test and measurement device as claimed in claim 9, wherein the one or more ADCs comprises an incident ADC configured to receive the incident signal from the signal generator, and a TDR/TDT ADC configured to receive the TDR/TDT signal from the DUT.

11. A method of sampling a waveform using a real-equivalent-time oscilloscope having a time domain reflectometry source, comprising:
   controlling a clock synthesizer to produce a sample clock and a source control signal;
   using a time domain reflectometry (TDR) source to receive the source control signal and to produce an incident signal to be applied to a device under test (DUT);
   receiving the sample clock at one or more analog-to-digital converters (ADC) and sampling the incident signal from the TDR source and a TDR/TDT signal from the DUT to produce an incident waveform and a TDR/TDT waveform;
   determining time locations for samples in the incident waveform and the TDR/TDT waveform, using a period of the TDR source, a period of the sample clock, and a number of samples; and
   displaying the incident waveform and the TDR/TDT waveform.

12. The method as claimed in claim 11, wherein determining time locations for samples further comprises determining time locations for samples according to:
   $t_{RET}(i) = \mod(i*T_{sample}, T_{TDR})$, wherein $T_{sample}$ is the period of the sample clock, and $T_{TDR}$ is the period of TDR clock signal and equals the initial TDR clock signal multiplied by a clock divider.

13. The method as claimed in claim 12, wherein a sample period equals:

$$T_{sample\_RET} = \mod(T_{TDR}, T_{sample}).$$

14. The method as claimed in claim 11, wherein:
   the source control signal comprises a preliminary TDR clock signal; and wherein using the TDR source to receive the source control signal and to produce the incident signal to be applied to the DUT comprises:
      applying a clock divider to the preliminary TDR clock signal to produce a TDR clock; and
      using a step signal generator to receive the TDR clock and produce the incident signal to be applied to the DUT.

15. The method as claimed in claim 14, wherein sampling the incident signal at one or more ADCs comprises sampling the incident signal from the TDR source and the TDR/TDT signal from the DUT at one ADC.

16. The method as claimed in claim 11, wherein:
   the source control signal comprises a digital-to-analog converter (DAC) clock signal; and wherein using the TDR source to receive the source control signal and to produce the incident signal to be applied to the DUT comprises:
  using a DAC to receive the DAC clock signal and to produce a pattern waveform;
  producing an oscillating signal; and
  mixing the pattern waveform from the DAC and the oscillating signal to produce the incident signal to be applied to the DUT.

17. The method as claimed in claim 16, wherein sampling the incident signal at one or more ADCs comprises sampling the incident signal from the TDR source at an incident ADC and the TDR/TDT signal from the DUT at a TDR/TDT ADC.

18. The method as claimed in claim 16, wherein mixing the pattern waveform and the oscillating signal comprises shifting a spectrum of the pattern waveform to a higher frequency band.

19. The method as claimed in claim 11, wherein:
  the source control signal comprises a frequency selection signal; and wherein using the TDR source to receive the source control signal and to produce the incident signal to be applied to the DUT comprises:
    using a signal generator to receive the frequency selection signal and generate a sine wave as the incident signal to be applied to the DUT.

20. The method as claimed in claim 19, wherein sampling the incident signal at one or more ADCs comprises sampling the incident signal from the TDR source at an incident ADC and the TDR/TDT signal from the DUT at a TDR/TDT ADC.

\* \* \* \* \*